United States Patent
Akashige et al.

(10) Patent No.: US 12,165,736 B2
(45) Date of Patent: Dec. 10, 2024

(54) SEMICONDUCTOR DEVICE

(71) Applicant: RENESAS ELECTRONICS CORPORATION, Tokyo (JP)

(72) Inventors: Takanori Akashige, Tokyo (JP); Kazunori Yamane, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 166 days.

(21) Appl. No.: 18/062,689

(22) Filed: Dec. 7, 2022

(65) Prior Publication Data

US 2023/0206968 A1  Jun. 29, 2023

(30) Foreign Application Priority Data

Dec. 24, 2021 (JP) ................... 2021-211407

(51) Int. Cl.
 *G11C 7/10* (2006.01)
 *G06F 7/57* (2006.01)

(52) U.S. Cl.
 CPC ............... *G11C 7/109* (2013.01); *G06F 7/57* (2013.01); *G11C 7/1063* (2013.01)

(58) Field of Classification Search
 None
 See application file for complete search history.

(56) References Cited

U.S. PATENT DOCUMENTS

| | | | | |
|---|---|---|---|---|
| 7,543,130 B2* | 6/2009 | Muraki | ................ | G06F 9/4403 711/170 |
| 8,631,173 B2* | 1/2014 | Yoshikawa | ........... | G06F 9/3879 710/52 |
| 8,681,525 B2 | 3/2014 | Sato | | |
| 10,283,178 B2 | 5/2019 | Takahashi | | |
| 11,615,299 B2* | 3/2023 | Mochida | ................ | G06N 3/065 706/41 |
| 2009/0207642 A1* | 8/2009 | Shimano | ............. | G11C 11/1675 365/72 |

FOREIGN PATENT DOCUMENTS

| | | |
|---|---|---|
| JP | 2012-150565 A | 8/2012 |
| JP | 2018-055740 A | 4/2018 |

* cited by examiner

*Primary Examiner* — Tan T. Nguyen
(74) *Attorney, Agent, or Firm* — Rimon P.C.

(57) ABSTRACT

In a semiconductor device, an arithmetic circuit of a chip on a first stage performs a predetermined arithmetic operation on an input N-bit (N=4) selection signal. Similarly, an arithmetic circuit of each of chips on second and subsequent stages among chips on a total of M stages (M≥N≥2, M=16) performs a predetermined common arithmetic operation on an operation result of the arithmetic circuit of the chip on the preceding stage. A determination circuit provided in each chip performs a predetermined common logic operation on a bit string of the N-bit signal, which is the operation result of the corresponding arithmetic circuit, thereby determining whether it is the chip selected by the selection signal.

11 Claims, 14 Drawing Sheets

FIG. 5

|  | MB3 | MB2 | MB1 | MB0 |
|---|---|---|---|---|
| CHIP_15 | 1 | 1 | 1 | 1 |
| CHIP_14 | 1 | 1 | 1 | 0 |
| CHIP_13 | 1 | 1 | 0 | 1 |
| CHIP_12 | 1 | 1 | 0 | 0 |
| CHIP_11 | 1 | 0 | 1 | 1 |
| CHIP_10 | 1 | 0 | 1 | 0 |
| CHIP_9 | 1 | 0 | 0 | 1 |
| CHIP_8 | 1 | 0 | 0 | 0 |
| CHIP_7 | 0 | 1 | 1 | 1 |
| CHIP_6 | 0 | 1 | 1 | 0 |
| CHIP_5 | 0 | 1 | 0 | 1 |
| CHIP_4 | 0 | 1 | 0 | 0 |
| CHIP_3 | 0 | 0 | 1 | 1 |
| CHIP_2 | 0 | 0 | 1 | 0 |
| CHIP_1 | 0 | 0 | 0 | 1 |
| CHIP_0 | 0 | 0 | 0 | 0 |

| INPUT(BASE DIE) | | | |
|---|---|---|---|
| MF3 | MF2 | MF1 | MF0 |
| 1 | 1 | 1 | 1 |

FIG. 6

| MF3 | MF2 | MF1 | MF0 | SELECTED CHIP |
|---|---|---|---|---|
| 1 | 1 | 1 | 0 | CHIP_0 |
| 1 | 1 | 0 | 1 | CHIP_1 |
| 1 | 1 | 0 | 0 | CHIP_2 |
| 1 | 0 | 1 | 1 | CHIP_3 |
| 1 | 0 | 1 | 0 | CHIP_4 |
| 1 | 0 | 0 | 1 | CHIP_5 |
| 1 | 0 | 0 | 0 | CHIP_6 |
| 0 | 1 | 1 | 1 | CHIP_7 |
| 0 | 1 | 1 | 0 | CHIP_8 |
| 0 | 1 | 0 | 1 | CHIP_9 |
| 0 | 1 | 0 | 0 | CHIP_10 |
| 0 | 0 | 1 | 1 | CHIP_11 |
| 0 | 0 | 1 | 0 | CHIP_12 |
| 0 | 0 | 0 | 1 | CHIP_13 |
| 0 | 0 | 0 | 0 | CHIP_14 |
| 1 | 1 | 1 | 1 | CHIP_15 |

FIG. 8

| MF3 | MF2 | MF1 | MF0 | SELECTED CHIP |
|---|---|---|---|---|
| 1 | 1 | 1 | 1 | CHIP_0 |
| 1 | 1 | 1 | 0 | CHIP_1 |
| 1 | 1 | 0 | 1 | CHIP_2 |
| 1 | 1 | 0 | 0 | CHIP_3 |
| 1 | 0 | 1 | 1 | CHIP_4 |
| 1 | 0 | 1 | 0 | CHIP_5 |
| 1 | 0 | 0 | 1 | CHIP_6 |
| 1 | 0 | 0 | 0 | CHIP_7 |
| 0 | 1 | 1 | 1 | CHIP_8 |
| 0 | 1 | 1 | 0 | CHIP_9 |
| 0 | 1 | 0 | 1 | CHIP_10 |
| 0 | 1 | 0 | 0 | CHIP_11 |
| 0 | 0 | 1 | 1 | CHIP_12 |
| 0 | 0 | 1 | 0 | CHIP_13 |
| 0 | 0 | 0 | 1 | CHIP_14 |
| 0 | 0 | 0 | 0 | CHIP_15 |

| | MB4 | MB3 | MB2 | MB1 | MB0 |
|---|---|---|---|---|---|
| CHIP_31 | 1 | 1 | 1 | 1 | 1 |
| CHIP_30 | 1 | 1 | 1 | 1 | 0 |
| CHIP_29 | 1 | 1 | 1 | 0 | 1 |
| CHIP_28 | 1 | 1 | 1 | 0 | 0 |
| CHIP_27 | 1 | 1 | 0 | 1 | 1 |
| CHIP_26 | 1 | 1 | 0 | 1 | 0 |
| CHIP_25 | 1 | 1 | 0 | 0 | 1 |
| CHIP_24 | 1 | 1 | 0 | 0 | 0 |
| CHIP_23 | 1 | 0 | 1 | 1 | 1 |
| CHIP_22 | 1 | 0 | 1 | 1 | 0 |
| CHIP_21 | 1 | 0 | 1 | 0 | 1 |
| CHIP_20 | 1 | 0 | 1 | 0 | 0 |
| CHIP_19 | 1 | 0 | 0 | 1 | 1 |
| CHIP_18 | 1 | 0 | 0 | 1 | 0 |
| CHIP_17 | 1 | 0 | 0 | 0 | 1 |
| CHIP_16 | 1 | 0 | 0 | 0 | 0 |
| CHIP_15 | 0 | 1 | 1 | 1 | 1 |
| CHIP_14 | 0 | 1 | 1 | 1 | 0 |
| CHIP_13 | 0 | 1 | 1 | 0 | 1 |
| CHIP_12 | 0 | 1 | 1 | 0 | 0 |
| CHIP_11 | 0 | 1 | 0 | 1 | 1 |
| CHIP_10 | 0 | 1 | 0 | 1 | 0 |
| CHIP_9 | 0 | 1 | 0 | 0 | 1 |
| CHIP_8 | 0 | 1 | 0 | 0 | 0 |
| CHIP_7 | 0 | 0 | 1 | 1 | 1 |
| CHIP_6 | 0 | 0 | 1 | 1 | 0 |
| CHIP_5 | 0 | 0 | 1 | 0 | 1 |
| CHIP_4 | 0 | 0 | 1 | 0 | 0 |
| CHIP_3 | 0 | 0 | 0 | 1 | 1 |
| CHIP_2 | 0 | 0 | 0 | 1 | 0 |
| CHIP_1 | 0 | 0 | 0 | 0 | 1 |
| CHIP_0 | 0 | 0 | 0 | 0 | 0 |

| INPUT (BASE DIE) | | | | |
|---|---|---|---|---|
| MF4 | MF3 | MF2 | MF1 | MF0 |
| 1 | 1 | 1 | 1 | 1 |

FIG. 10

| MF4 | MF3 | MF2 | MF1 | MF0 | SELECTED CHIP |
|---|---|---|---|---|---|
| 1 | 1 | 1 | 1 | 0 | CHIP_0 |
| 1 | 1 | 1 | 0 | 1 | CHIP_1 |
| 1 | 1 | 1 | 0 | 0 | CHIP_2 |
| 1 | 1 | 0 | 1 | 1 | CHIP_3 |
| 1 | 1 | 0 | 1 | 0 | CHIP_4 |
| 1 | 1 | 0 | 0 | 1 | CHIP_5 |
| 1 | 1 | 0 | 0 | 0 | CHIP_6 |
| 1 | 0 | 1 | 1 | 1 | CHIP_7 |
| 1 | 0 | 1 | 1 | 0 | CHIP_8 |
| 1 | 0 | 1 | 0 | 1 | CHIP_9 |
| 1 | 0 | 1 | 0 | 0 | CHIP_10 |
| 1 | 0 | 0 | 1 | 1 | CHIP_11 |
| 1 | 0 | 0 | 1 | 0 | CHIP_12 |
| 1 | 0 | 0 | 0 | 1 | CHIP_13 |
| 1 | 0 | 0 | 0 | 0 | CHIP_14 |
| 0 | 1 | 1 | 1 | 1 | CHIP_15 |
| 0 | 1 | 1 | 1 | 0 | CHIP_16 |
| 0 | 1 | 1 | 0 | 1 | CHIP_17 |
| 0 | 1 | 1 | 0 | 0 | CHIP_18 |
| 0 | 1 | 0 | 1 | 1 | CHIP_19 |
| 0 | 1 | 0 | 1 | 0 | CHIP_20 |
| 0 | 1 | 0 | 0 | 1 | CHIP_21 |
| 0 | 1 | 0 | 0 | 0 | CHIP_22 |
| 0 | 0 | 1 | 1 | 1 | CHIP_23 |
| 0 | 0 | 1 | 1 | 0 | CHIP_24 |
| 0 | 0 | 1 | 0 | 1 | CHIP_25 |
| 0 | 0 | 1 | 0 | 0 | CHIP_26 |
| 0 | 0 | 0 | 1 | 1 | CHIP_27 |
| 0 | 0 | 0 | 1 | 0 | CHIP_28 |
| 0 | 0 | 0 | 0 | 1 | CHIP_29 |
| 0 | 0 | 0 | 0 | 0 | CHIP_30 |
| 1 | 1 | 1 | 1 | 1 | CHIP_31 |

FIG. 13

|  | MB3 | MB2 | MB1 | MB0 |
|---|---|---|---|---|
| CHIP_15 | 1 | 1 | 1 | 1 |
| CHIP_14 | 0 | 0 | 0 | 0 |
| CHIP_13 | 0 | 0 | 0 | 1 |
| CHIP_12 | 0 | 0 | 1 | 0 |
| CHIP_11 | 0 | 0 | 1 | 1 |
| CHIP_10 | 0 | 1 | 0 | 0 |
| CHIP_9 | 0 | 1 | 0 | 1 |
| CHIP_8 | 0 | 1 | 1 | 0 |
| CHIP_7 | 0 | 1 | 1 | 1 |
| CHIP_6 | 1 | 0 | 0 | 0 |
| CHIP_5 | 1 | 0 | 0 | 1 |
| CHIP_4 | 1 | 0 | 1 | 0 |
| CHIP_3 | 1 | 0 | 1 | 1 |
| CHIP_2 | 1 | 1 | 0 | 0 |
| CHIP_1 | 1 | 1 | 0 | 1 |
| CHIP_0 | 1 | 1 | 1 | 0 |

| INPUT (BASE DIE) | | | |
|---|---|---|---|
| MF3 | MF2 | MF1 | MF0 |
| 1 | 1 | 1 | 1 |

FIG. 14

| MF3 | MF2 | MF1 | MF0 | SELECTED CHIP |
|---|---|---|---|---|
| 0 | 0 | 0 | 0 | CHIP_0 |
| 0 | 0 | 0 | 1 | CHIP_1 |
| 0 | 0 | 1 | 0 | CHIP_2 |
| 0 | 0 | 1 | 1 | CHIP_3 |
| 0 | 1 | 0 | 0 | CHIP_4 |
| 0 | 1 | 0 | 1 | CHIP_5 |
| 0 | 1 | 1 | 0 | CHIP_6 |
| 0 | 1 | 1 | 1 | CHIP_7 |
| 1 | 0 | 0 | 0 | CHIP_8 |
| 1 | 0 | 0 | 1 | CHIP_9 |
| 1 | 0 | 1 | 0 | CHIP_10 |
| 1 | 0 | 1 | 1 | CHIP_11 |
| 1 | 1 | 0 | 0 | CHIP_12 |
| 1 | 1 | 0 | 1 | CHIP_13 |
| 1 | 1 | 1 | 0 | CHIP_14 |
| 1 | 1 | 1 | 1 | CHIP_15 |

SEMICONDUCTOR DEVICE

CROSS-REFERENCE TO RELATED APPLICATIONS

The disclosure of Japanese Patent Application No. 2021-211407 filed on Dec. 24, 2021 including the specification, drawings and abstract is incorporated herein by reference in its entirety.

BACKGROUND

This disclosure relates to a semiconductor device and is suitably used in, for example, a semiconductor device having a stacked structure in which a plurality of semiconductor chips is stacked.

In recent years, a stacked semiconductor device in which a plurality of stacked semiconductor chips is housed in one package and the semiconductor chips are connected to each other via Si-TSVs (Through Silicon Vias) has been developed. In this type of semiconductor device, it is necessary to select a semiconductor chip to be accessed from among the plurality of semiconductor chips. There are disclosed techniques listed below.

[Patent Document 1] Japanese Unexamined Patent Application Publication No. 2018-055740
[Patent Document 2] Japanese Unexamined Patent Application Publication No. 2012-150565

Specifically, in Japanese Unexamined Patent Application Publication No. 2018-055740 (Patent Document 1), in order to transmit a chip selection signal to n memory chips, n through electrodes formed in each memory chip are used. By the internal wiring of each memory chip, the lower pads corresponding to the first to (n−1)th through electrodes are connected to the upper pads corresponding to the second to nth through electrodes. Furthermore, the lower pad corresponding to the nth through electrode is connected to the upper pad corresponding to the first through electrode. By the shift-circular connection like this, the chip selection signal passes through all of the first to nth through electrodes while transmitting through the n memory chips. Only the through electrode of a specific number is connected to the internal circuit of each memory chip.

The semiconductor device disclosed in Japanese Unexamined Patent Application Publication No. 2012-150565 (Patent Document 2) includes a plurality of core chips each having a unique chip address and an interface chip that controls them. The interface chip generates a chip selection address from an address signal and a chip selection signal according to a mode signal. Each core chip has a comparison circuit that compares the chip selection address with the unique chip address and passes the command if they match.

SUMMARY

In the chip selection method disclosed in Japanese Unexamined Patent Application Publication No. 2018-055740 (Patent Document 1), when the number of stacked semiconductor chips is doubled, the number of through electrodes used to transmit the chip selection signal is also doubled. Along with this, the power supply capacity for supplying the chip selection signal also increases, which causes a problem of increase in area overhead.

In the chip selection method disclosed in Japanese Unexamined Patent Application Publication No. 2012-150565 (Patent Document 2), the unique chip address for each semiconductor chip needs to be stored in advance in a memory, a register, or the like. For this reason, the management of the chip address takes a lot of trouble, and it cannot be said that this method is practical.

Other problems and novel features will become apparent from the description of this specification and the accompanying drawings.

In the semiconductor device according to embodiment, an arithmetic circuit of a chip on the first stage performs a predetermined arithmetic operation on an input N-bit selection signal. An arithmetic circuit of a chip on the second stage performs the same arithmetic operation on the operation result. In this way, an arithmetic circuit of each of the chips on the second and subsequent stages among the chips on a total of M stages (M>N≥2) performs the predetermined common arithmetic operation on the operation result of the arithmetic circuit of the chip on the preceding stage. A determination circuit provided in each chip performs a predetermined common logic operation on a bit string of an N-bit signal, which is the operation result of the corresponding arithmetic circuit, thereby determining whether it is the chip selected by the selection signal.

By the semiconductor device according to the embodiment mentioned above, the area overhead can be reduced, and it becomes unnecessary to store the unique chip address for each chip in a memory or the like in advance.

BRIEF DESCRIPTION OF THE DRAWINGS

FIG. 5 is a diagram for describing a specific operation of the arithmetic circuit in FIG. 4.

FIG. 6 is a diagram showing a selection signal MF to be input from a base die 11 for selecting each chip in FIG. 4, in a tabular form.

FIG. 8 is a diagram showing the selection signal MF to be input from the base die 11 for selecting each chip in FIG. 7, in a tabular form.

FIG. 10 is a diagram showing the selection signal MF to be input from the base die 11 for selecting each chip in the case where the number of chips in FIG. 4 is extended to 32, in a tabular form.

FIG. 13 is a diagram for describing a specific operation of the arithmetic circuit in FIG. 12.

FIG. 14 is a diagram showing the selection signal MF to be input from the base die 11 for selecting each chip in FIG. 12, in a tabular form.

DETAILED DESCRIPTION

Figure 1:
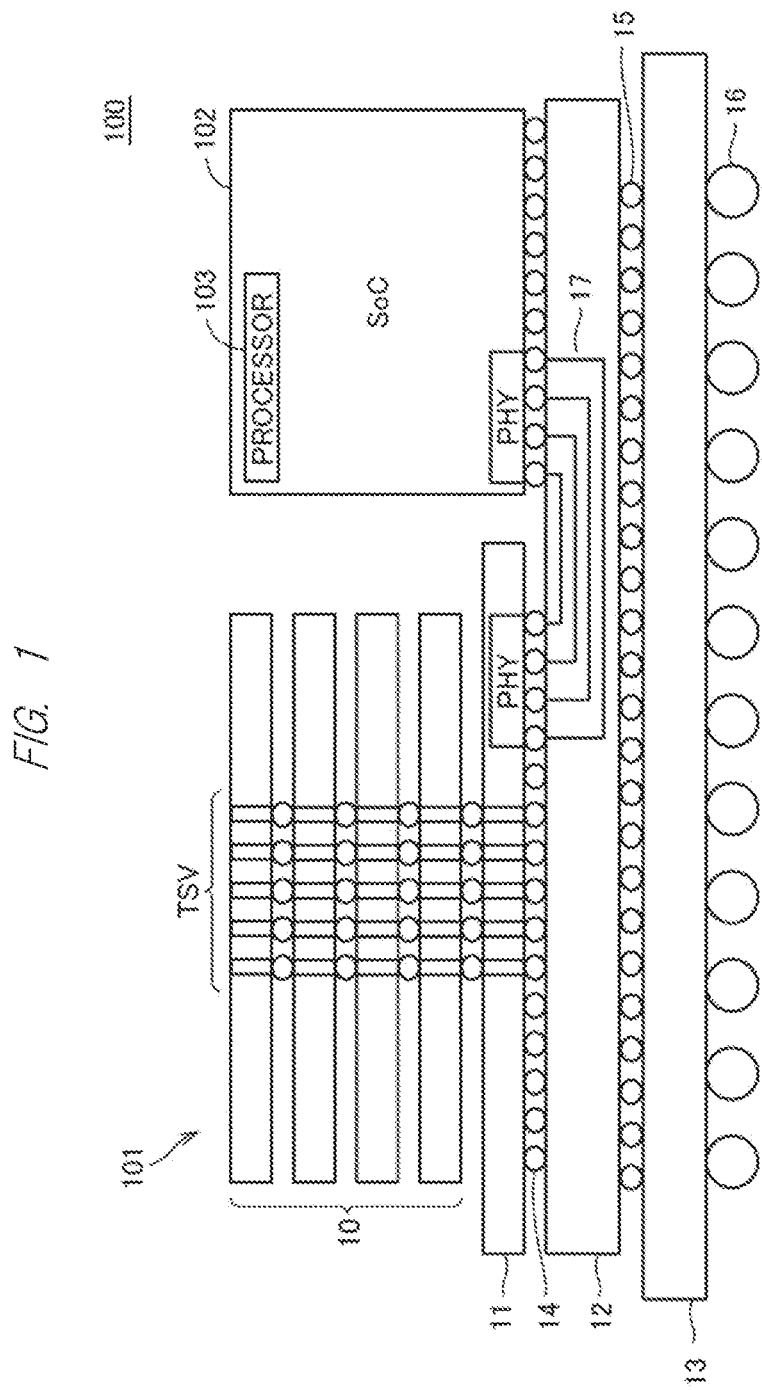
FIG. 1 is a cross-sectional view showing a schematic configuration of a semiconductor device 100 according to the first embodiment.

Hereinafter, each embodiment will be described in detail with reference to drawings. Note that the same or corresponding parts are denoted by the same reference characters, and the description thereof is not repeated.

First Embodiment

[Schematic Configuration of Semiconductor Device]

FIG. 1 is a cross-sectional view showing a schematic configuration of a semiconductor device 100 according to the first embodiment. The semiconductor device 100 in FIG. 1 is a semiconductor package called a high bandwidth memory (HBM). The semiconductor device 100 includes a plurality of memory chips 10, a base die 11, an interposer 12, a system-on-chip (SoC) 102, and a package board 13. The memory chip 10 will be simply referred to also as the chip 10 below.

As shown in FIG. 1, in the semiconductor device 100, a stacked structure 101 of the memory chips 10 and the base die 11 stacked by TSVs and the SoC 102 are connected via the interposer 12. Specifically, the base die 11 and the SoC 102 are connected via signal lines 17 and bumps 14 of the interposer 12.

Semiconductor integrated circuits are fabricated on the surfaces of the memory chips 10 and the base die 11 by using normal semiconductor process. For example, a DRAM (Dynamic Random Access Memory) core circuit and others are formed on the memory chip 10. An interface (I/F) circuit such as a memory controller, a physical layer (PHY) circuit for connecting with the SoC 102, and the like are formed on the base die 11. A memory circuit such as the DRAM core circuit mounted on the memory chip 10 is controlled by a processor (PROCESSOR) 103 mounted in the SoC 102.

The interposer 12 is formed of an Si semiconductor. A large number of fine signal lines 17 are formed in the interposer 12 by using semiconductor processing technology. Furthermore, contact plugs (not shown) and through electrodes (not shown) penetrating an interlayer insulating layer are formed between the bumps 14 on the front surface of the interposer 12 and bumps 15 on the back surface.

The package board 13 is formed of a printed circuit board (PCB). A plurality of solder balls 16 called BGA (Ball Grid Array) is formed as external connection terminals on a lower surface of the package board 13.

[Principle of Chip Selection Method]

Next, the principle of the chip selection method in the semiconductor device according to this embodiment will be described with reference to FIG. 2 and FIG. 3. Hereinafter, more generally, a method of selecting a module when a semiconductor device 200 includes M cascaded modules MOD_0 to MOD_M−1 will be described below. In this case, the M modules are not limited to the stacked structure and to memory chips.

Figure 2:
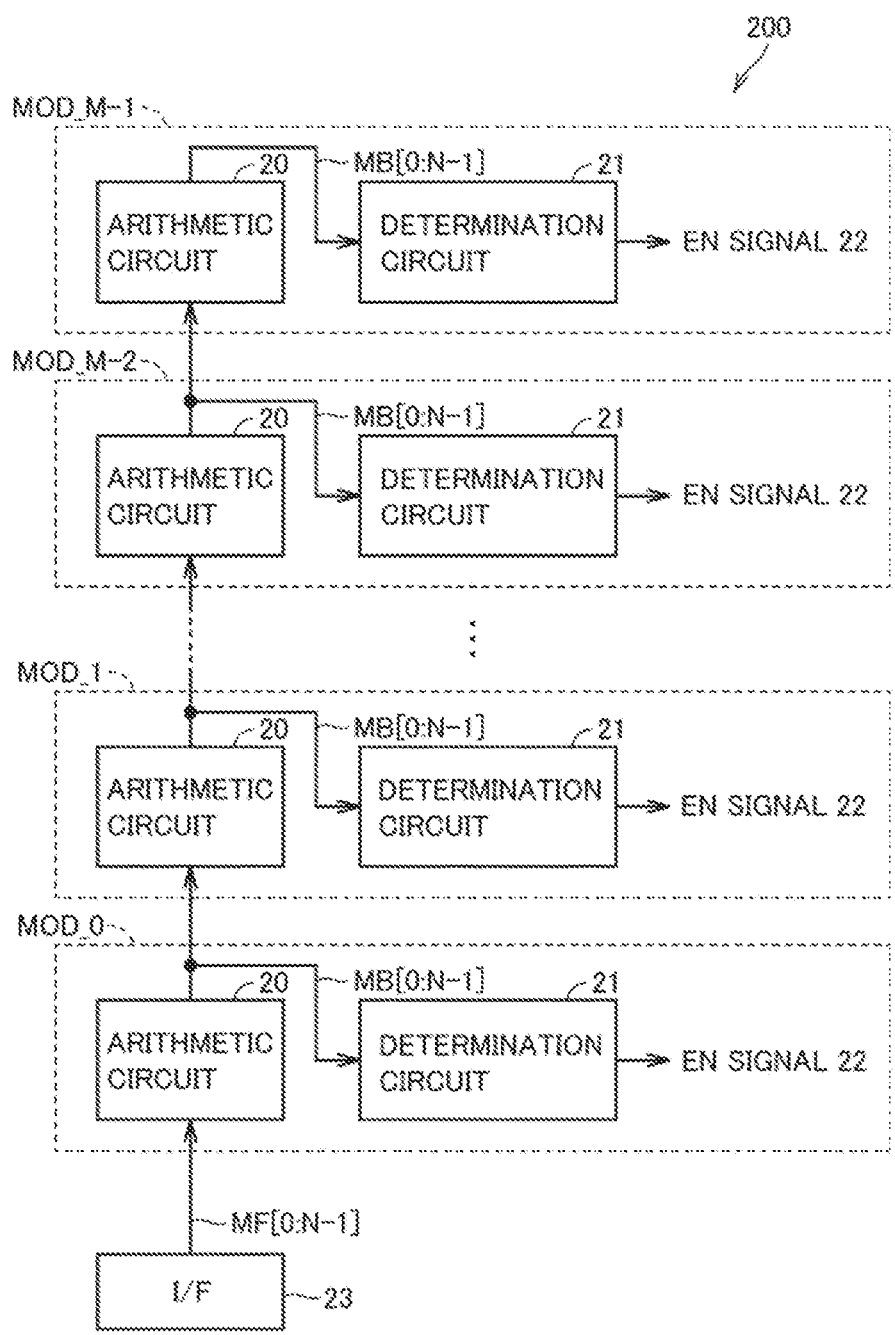
FIG. 2 is a diagram for describing the module selection method.

FIG. 2 is a diagram for describing the module selection method. Referring to FIG. 2, the semiconductor device 200 includes cascaded modules MOD_0 to MOD_M−1 on M stages each having a common circuit configuration. Hereinafter, when any one of the modules MOD_0 to MOD_M−1 on M stages is indicated, it will be referred to as a module MOD.

Each module MOD includes an arithmetic circuit (ARITHMETIC CIRCUIT) 20 and a determination circuit (DETERMINATION CIRCUIT) 21. These circuits are used for module selection and are common to each module MOD.

As shown in FIG. 2, an N-bit selection signal MF [0:N−1] is input from an interface circuit (I/F) 23 to the arithmetic circuit 20 of the module MOD_0 on the first stage. Regarding M and N, there is a relationship of M>N≥2. It is usually set to M=2N. The selection signal MF is a signal for selecting one of the modules MOD_0 to MOD_M−1 on the M stages.

The arithmetic circuit 20 of the module MOD_0 on the first stage performs an N-bit arithmetic operation on the input N-bit selection signal MF. An N-bit signal generated as a result of this arithmetic operation is input to the determination circuit 21 of the module MOD_0 on the first stage as a determination signal MB [0:N−1].

The N-bit signal which is the operation result of the arithmetic circuit 20 of the module MOD_0 on the first stage is input to the arithmetic circuit 20 of the module MOD_1 on the second stage. The arithmetic circuit 20 of the module MOD_1 on the second stage performs the same arithmetic operation as that of the arithmetic circuit 20 of the module MOD_0 on the first stage on the input N-bit signal. An N-bit signal generated as a result of this arithmetic operation is input to the determination circuit 21 of the module MOD_1 on the second stage as the determination signal MB [0:N−1].

The same applies to the arithmetic circuit 20 of each of the modules MOD from the third to Mth stages. Namely, each arithmetic circuit 20 performs the same arithmetic operation as the arithmetic circuit 20 of the module MOD_0 on the first stage on the N-bit signal which is the operation result of the arithmetic circuit 20 of the module MOD on the preceding stage. In other words, the arithmetic operations performed d by the respective arithmetic circuits 20 are the same arithmetic operations commonly determined for the modules MOD_0 to MOD_M−1 on the M stages. In each module MOD, the N-bit signal which is the operation result of the arithmetic circuit 20 is input to the determination circuit 21 as the determination signal MB [0:N−1].

Here, it is possible to determine the N-bit arithmetic operation such that the operation results of the arithmetic circuits 20 of the modules MOD_0 to MOD_M−1 on the M stages differ from each other. For example, the arithmetic operation of adding "1" to the input N-bit signal generates different operation results for the respective modules MOD regardless of the selection signal MF input first. Namely, each arithmetic circuit 20 may be an N-bit adder that adds "1". When extending this, it is easily understood that each arithmetic circuit 20 may be an N-bit adder that adds a predetermined odd number such as "11" or "101".

Similarly, the arithmetic operation of subtracting "1" from the input N-bit signal generates different operation results for the respective modules MOD regardless of the selection signal MF input first. Namely, each arithmetic circuit 20 may be an N-bit subtractor that subtracts "1". When extending this, it is easily understood that each arithmetic circuit 20 may be an N-bit subtractor that subtracts a predetermined odd number.

Next, each determination circuit 21 determines whether or not the bit string of the input determination signal MB [0:N−1] matches a specific bit string. The specific bit string is commonly determined for the modules MOD_0 to MOD_M−1 on the M stages. More specifically, each determination circuit 21 generates an enable signal (EN SIGNAL) 22 by performing a logical operation using the value of each bit of the input determination signal MB[0:N−1].

This logical operation is determined in common for the modules MOD_0 to MOD_M−1 on the M stages. The enable signal 22 is asserted when the bit string of the input determination signal MB [0:N−1] matches the specific bit string.

The internal circuit of each module MOD becomes operable upon receiving the asserted enable signal 22. For example, a case where a controller (not shown, corresponding to the processor 103 in FIG. 1) provided in the semiconductor device 200 operates an internal circuit of a certain selected module MOD will be described. In this case, the controller determines the selection signal MF such that the enable signal 22 generated by the determination circuit 21 of the selected module MOD is asserted. Then, the controller causes the interface circuit 23 to input the determined selection signal MF to the module MOD_0 on the first stage.

Figure 3:
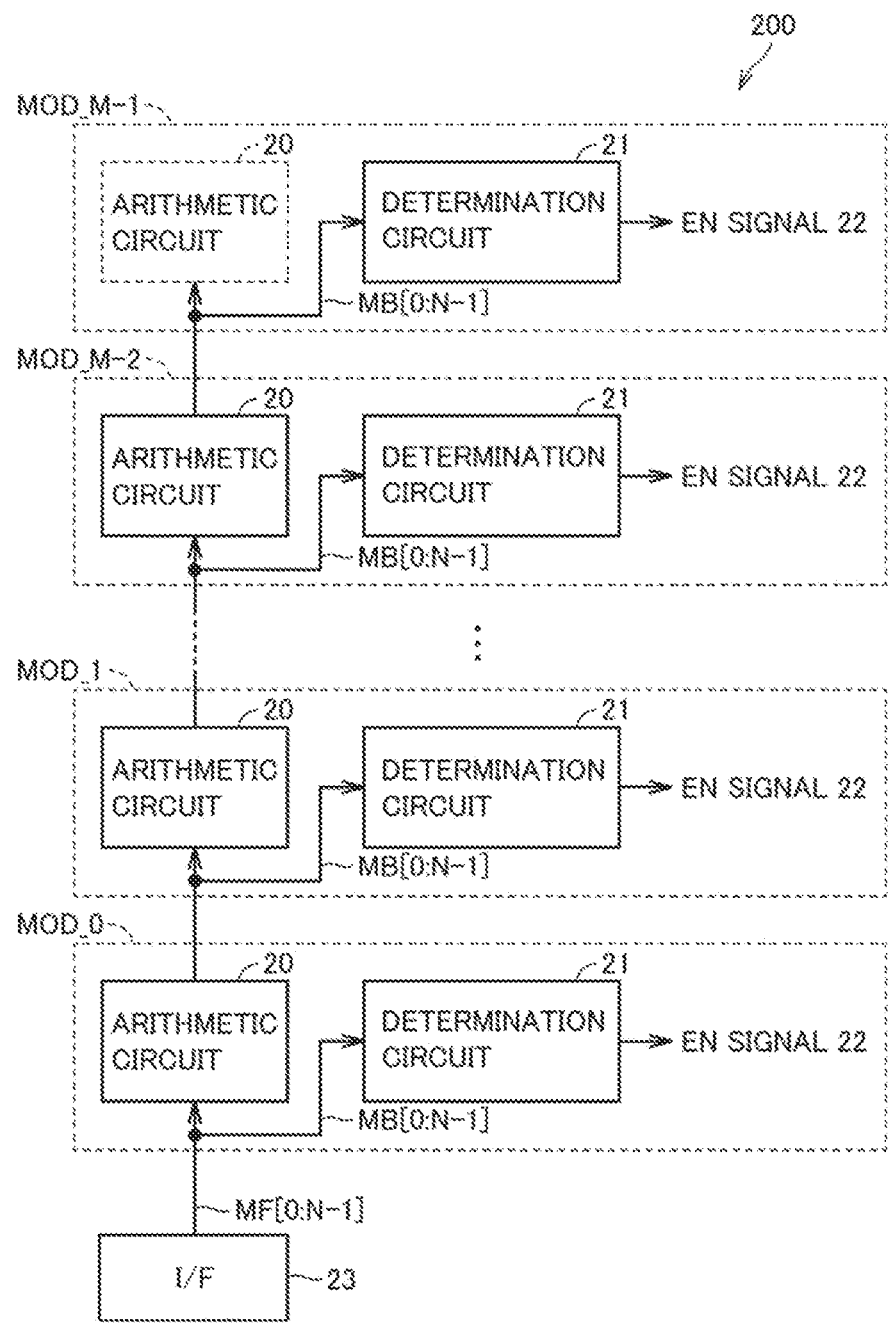
FIG. 3 is a diagram for describing a modification of the module selection method in FIG. 2.

FIG. 3 is a diagram for describing a modification of the module selection method in FIG. 2. In the case of FIG. 3, the N-bit selection signal MF is input from the interface circuit 23 to the determination circuit 21 of the module MOD_0 on the first stage, instead of the operation result of the arithmetic circuit 20 of the module MOD_0 on the first stage. Similarly, the N-bit signal which is the operation result of the arithmetic circuit 20 of the module MOD on the preceding stage is input to the determination circuit 21 of each of the modules MOD from the second to Mth stages. As described above, the semiconductor device 200 in FIG. 3 differs from the semiconductor device 200 in FIG. 2 in the determination signal MB [0:N−1] input to each determination circuit 21. Furthermore, in the case of FIG. 3, the arithmetic circuit 20 does not have to be provided in the (M−1)th module MOD_M−1 on the last stage.

Since the others in FIG. 3 are the same as those in FIG. 2, the same or corresponding parts are denoted by the same reference characters, and the description thereof is not repeated. In the case of FIG. 3 as well, the enable signal 22 generated by the desired chip 10 can be asserted by changing the selection signal MF output from the interface circuit 23.

[Specific Example of Arithmetic Circuit and Enable Signal Generation Circuit (Part 1)]

Figure 4:
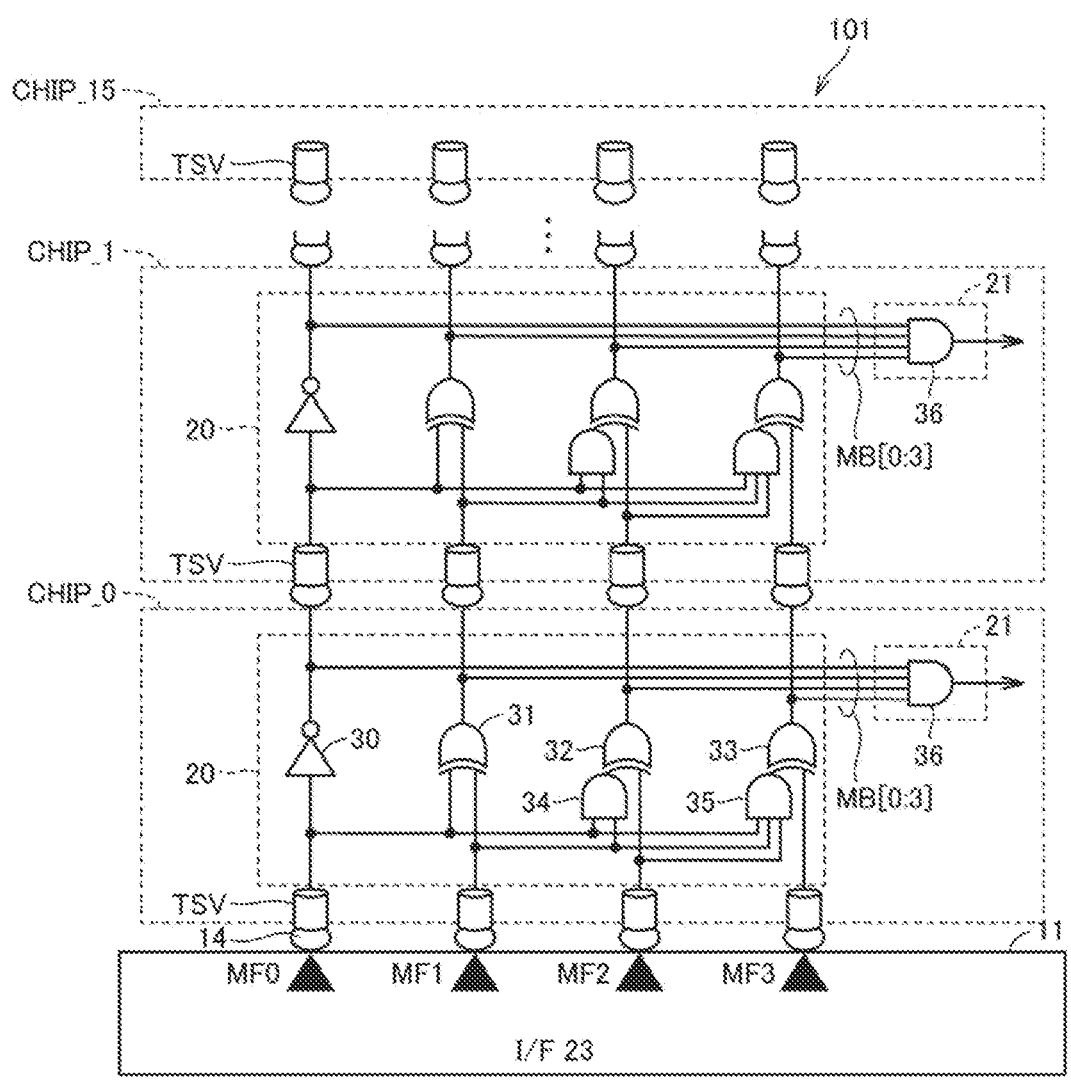
FIG. 4 is a diagram showing a specific example of the arithmetic circuit 20 and the determination circuit 21 in FIG. 2.

Next, a specific example of the arithmetic circuit 20 and the determination circuit 21 in FIG. 2 and FIG. 3 will be described. FIG. 4 is a diagram showing a specific example of the arithmetic circuit 20 and the determination circuit 21 in FIG. 2.

The example of FIG. 4 shows a case where memory chips 10 on sixteen stages are provided as the stacked structure 101 of the semiconductor device 100. In FIG. 4, the memory chips 10 on the sixteen stages are indicated as CHIP_0 to CHIP_15. The memory chips CHIP_0 to CHIP_15 correspond to the modules MOD_0 to MOD 15 (where M=16) in FIG. 2, respectively.

A 4-bit selection signal MF[0:3] is used to select any one of these memory chips CHIP_0 to CHIP_15. The least significant bit (first bit) of the selection signal MF[0:3] is indicated as MF0. The second bit is indicated as MF1. The third bit is indicated as the selection signal MF2. The most significant bit (fourth bit) is indicated as the selection signal MF3. The same applies to the determination signal MB [0:3].

As shown in FIG. 4, the arithmetic circuits 20 provided in adjacent memory chips CHIP are connected by four signal lines, the number of which is equal to the number of bits N of the selection signal MF. Therefore, in the example of FIG. 4, the N-bit signal is transmitted for each bit in parallel. Each signal line includes a TSV.

Each arithmetic circuit 20 is configured as a 4-bit adder that adds "1" to the input N-bit signal. Specifically, the arithmetic circuit 20 includes a NOT circuit 30, exclusive OR circuits 31 to 33, and AND circuits 34 and 35. In order to obtain the output of the first bit, the NOT circuit 30 inverts the input of the first bit. In order to obtain the output of the second bit, the exclusive OR circuit 31 performs an exclusive OR operation of the input of the first bit and the input of the second bit. In order to obtain the output of the third bit, the AND circuit 34 first performs a logical AND operation of the input of the first bit and the input of the second bit. Next, the exclusive OR circuit 32 performs an exclusive OR operation of the output of the AND circuit 34 and the input of the third bit to generate the output of the third bit. In order to obtain the output of the fourth bit, the AND circuit 35 first performs a logical AND operation of the input of the first bit, the input of the second bit, and the input of the third bit. Next, the exclusive OR circuit 33 performs an exclusive OR operation of the output of the AND circuit 35 and the input of the fourth bit to generate the output of the fourth bit.

Each determination circuit 21 includes an AND circuit 36 that performs a logical AND operation of each bit for the determination signal MB [0:3] output from the corresponding arithmetic circuit 20. Therefore, when "1111" is output as the determination signal MB from the corresponding arithmetic circuit 20, the enable signal 22 output from the determination circuit 21 is asserted to "1". When the determination signal MB of other values is output from the corresponding arithmetic circuit 20, the enable signal 22 output from the determination circuit 21 is negated to "0".

FIG. 5 is a diagram for describing a specific operation of the arithmetic circuit in FIG. 4. In FIG. 5, the determination signal MB to be input to the determination circuit 21 of each chip CHIP when "1111" is input as the selection signal MF[0:3] from the base die (BASE DIE) 11 is shown in a tabular form. For ease of illustration, boxes of the bit "1" are hatched.

As shown in FIG. 5, the determination signal MB input to the determination circuit 21 of the chip CHIP_15 on the sixteenth stage is "1111". Therefore, the enable signal 22 output from the determination circuit 21 of the chip CHIP_15 on the sixteenth stage is asserted to "1". In other words, when "1111" is input as the selection signal MF[0:3] from the base die 11, the chip CHIP_15 on the sixteenth stage is selected.

FIG. 6 is a diagram showing the selection signal MF to be input from the base die 11 for selecting each chip in FIG. 4, in a tabular form. As shown in FIG. 6, each chip 10 can be uniquely selected by changing the selection signal MF[0:3] input from the base die 11. The correspondence relationship between the selection signal MF[0:3] and the chip 10 to be selected is determined by the stacking order of the chips 10. Therefore, in this embodiment, a register or a memory for storing identification numbers unique for each chip 10 is not required.

[Specific Example of Arithmetic Circuit and Enable Signal Generation Circuit (Part 2)]

Figure 7:
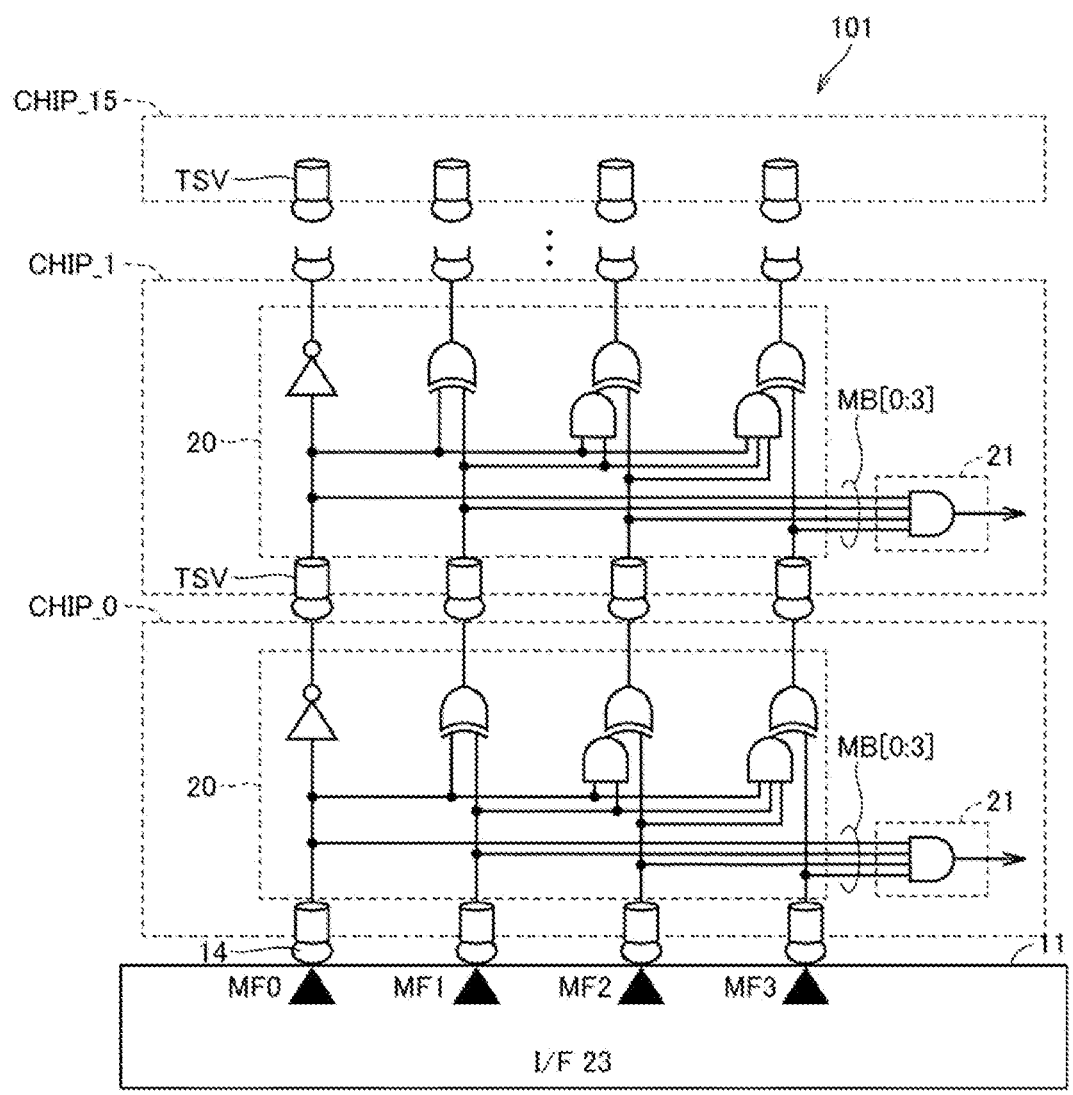
FIG. 7 is a diagram showing a specific example of the arithmetic circuit 20 and the determination circuit 21 in FIG. 3.

FIG. 7 is a diagram showing a specific example of the arithmetic circuit 20 and the determination circuit 21 in FIG. 3. In the case of the stacked structure 101 in FIG. 7, the determination signal MB input to the determination circuit 21 is not the operation result of the corresponding arithmetic circuit 20 of the same memory chip 10. The selection signal MF is input as the determination signal MB from the interface circuit 23 of the base die 11 to the determination circuit 21 of the memory chip CHIP_0 on the first stage. The operation result of the arithmetic circuit 20 of the memory chip CHIP on the preceding stage is input as the determination signal MB to the determination circuit 21 of each of the memory chips CHIP on the second and subsequent stages. In this respect, the stacked structure 101 in FIG. 7 differs from the stacked structure 101 in FIG. 4. Since the others in FIG. 7 are the same as those in FIG. 4, the same or corresponding parts are denoted by the same reference characters, and the description thereof is not repeated.

FIG. 8 is a diagram showing the selection signal MF to be input from the base die 11 for selecting each chip in FIG. 7, in a tabular form. As shown in FIG. 8, each chip 10 can be uniquely selected by changing the selection signal MF input from the base die 11.

[Specific Example of Arithmetic Circuit and Enable Signal Generation Circuit (Part 3)]

Next, a case where the number of memory chips 10 is extended from 16 to 32 in the specific example (part 1) described with reference to FIG. 4 to FIG. 6 will be described. In this case, the selection signal MF and the determination signal MB are changed to 5-bit signals. Each arithmetic circuit 20 is configured as a 5-bit adder that adds "1" to the input 5-bit signal.

Figure 9:
FIG. 9 is a diagram for describing a specific operation of the arithmetic circuit in the case where the number of chips in FIG. 4 is extended to 32.

FIG. 9 is a diagram for describing a specific operation of the arithmetic circuit in the case where the number of chips in FIG. 4 is extended to 32. In FIG. 9, the determination signal MB input to the determination circuit 21 of each chip 10 when "11111" is input as the selection signal MF[0:4] from the base die (BASE DIE) 11 is shown in a tabular form. As in the case of FIG. 5, boxes of the bit "1" are hatched for ease of illustration. Also, the first to fourth bits of the selection signal MF[0:4] are indicated as MF0 to MF3, and the most significant bit (fifth bit) is indicated as MF4. The same applies to the determination signals MB [0:4].

As shown in FIG. 9, the operation result of the arithmetic circuit 20 of the chip CHIP_31 (CHIP 31) on the thirty-second stage is "11111". Therefore, the output of the determination circuit 21 of the chip CHIP_31 on the thirty-second stage is asserted to "1". In other words, when "11111" is input as the selection signal MF[0:4] from the base die 11, the chip CHIP 31 on the thirty-second stage is selected.

FIG. 10 is a diagram showing the selection signal MF to be input from the base die 11 for selecting each chip in the case where the number of chips in FIG. 4 is extended to 32, in a tabular form. As shown in FIG. 10, each chip 10 can be uniquely selected by changing the selection signal MF[0:4] input from the base die 11. Therefore, as compared with the case of FIG. 6, the number of bits of the selection signal MF is increased by only one bit even if the number of chips is doubled. Accordingly, an increase in the area of the circuit for chip selection can be suppressed.

Effect of First Embodiment

As described above, in the semiconductor device 100 according to the first embodiment, the arithmetic circuit 20 and the determination circuit 21 are provided in each chip 10 in order to select the stacked memory chips 10. The circuit configurations of the arithmetic circuit 20 and the determination circuit 21 are the same regardless of the chips 10. The arithmetic circuit 20 performs an N-bit arithmetic operation on an input N-bit signal. For example, the arithmetic circuit 20 is configured as an N-bit adder that adds an odd number to an input N-bit signal. The N-bit selection signal MF is input to the arithmetic circuit 20 of the memory chip 10 on the first stage. The operation result of the arithmetic circuit 20 of the memory chip 10 on the preceding stage is input to the arithmetic circuit 20 of each of the memory chips 10 on the second and subsequent stages. The operation result of the corresponding arithmetic circuit 20 is input to the determination circuit 21 as the determination signal MB. The determination circuit 21 performs a logical operation using the value of each bit of the determination signal MB, and asserts the enable signal 22 when the bit string of the determination signal MB matches the predetermined specific bit string.

With such a configuration, there is no need to set a unique identification number for each memory chip 10. Any of the memory chips 10 can be uniquely selected by inputting the selection signal MF based on the stacking order of the memory chips 10. Also, M signal lines are not required to select one of the memory chips 10 on the M stages. Since the N-bit selection signal MF (M>N≥2) is used, the circuit area required for chip selection can be reduced.

Figure 11:
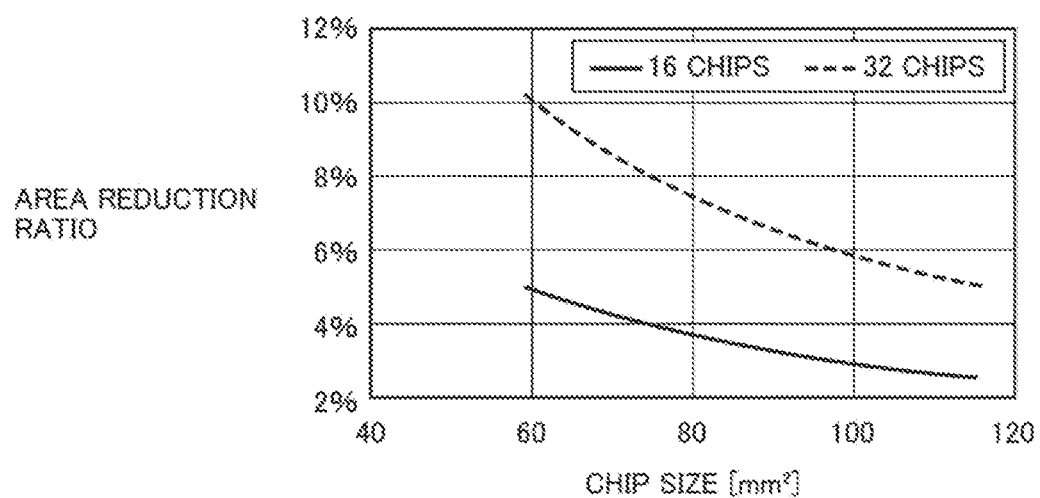
FIG. 11 is a diagram for describing an area reduction effect obtained by the semiconductor device according to the embodiment.

FIG. 11 is a diagram for describing an area reduction effect obtained by the semiconductor device according to the embodiment. Specifically, the graph in FIG. 11 shows the area reduction effect for the circuit component required for chip selection when compared with the method disclosed in Japanese Unexamined Patent Application Publication No. 2018-055740 (Patent Document 1) described in Background. The horizontal axis in FIG. 11 represents the chip size (CHIP SIZE) [mm$^2$], and the vertical axis represents the area reduction ratio (AREA REDUCTION RATIO) [%].

Referring to FIG. 11, when the number of stacked chips is 16 and the chip size is 100 mm$^2$, there is an area reduction effect of about 3% compared with the conventional technology. If the chip size is reduced to 70% by the reduction of the minimum line width of the semiconductor process in the future, an area reduction effect of about 4% can be expected. Also, the area reduction effect is further enhanced when the number of stacked chips is increased from 16 to 32.

Second Embodiment

In the second embodiment, a case where the arithmetic circuit 20 provided in each chip 10 is configured of a subtraction circuit instead of an addition circuit will be described.

Figure 12:
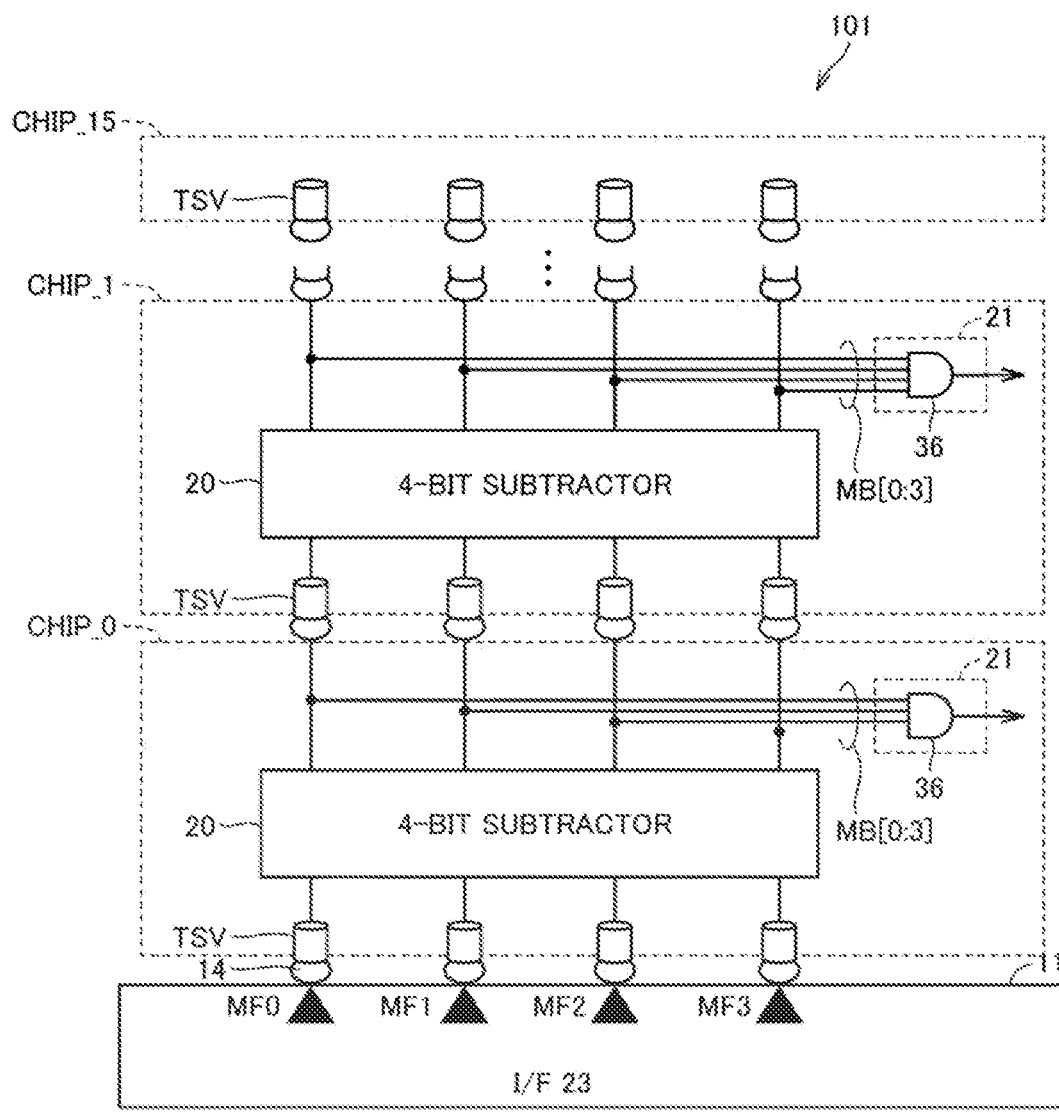
FIG. 12 is a diagram showing a specific example of a circuit for chip selection in a stacked semiconductor device according to the second embodiment.

FIG. 12 is a diagram showing a specific example of a circuit for chip selection in a stacked semiconductor device according to the second embodiment. In a stacked structure 101 in FIG. 12, each arithmetic circuit 20 is configured as an N-bit subtractor that subtracts "1" from an input N-bit (N=4) signal. In this respect, the stacked structure 101 in FIG. 12 differs from the stacked structure 101 in FIG. 4. Since the others in FIG. 12 are the same as those in FIG. 4, the same or corresponding parts are denoted by the same reference characters, and the description thereof is not repeated.

FIG. 13 is a diagram for describing a specific operation of the arithmetic circuit in FIG. 12. In FIG. 13, the determination signal MB input to the determination circuit 21 of each chip CHIP when "1111" is input as the selection signal MF[0:3] from the base die (BASE DIE) 11 is shown in a tabular form. For ease of illustration, boxes of the bit "1" are hatched.

As shown in FIG. 13, "1111" which is the operation result of the arithmetic circuit 20 of the chip CHIP_15 on the sixteenth stage is input to the determination circuit 21 as determination signal MB. Therefore, the enable signal 22 output from the determination circuit 21 of the chip CHIP_15 on the sixteenth stage is asserted to "1". In other words, when "1111" is input as the selection signal MF[0:3] from the base die 11, the chip CHIP_15 on the sixteenth stage is selected.

FIG. 14 is a diagram showing the selection signal MF to be input from the base die 11 for selecting each chip in FIG. 12, in a tabular form. As shown in FIG. 14, each chip CHIP can be uniquely selected by changing the selection signal MF[0:3] input from the base die 11. The correspondence relationship between the selection signal MF[0:3] and the chip CHIP is determined by the stacking order of the chips CHIP. Therefore, a register or a memory for storing identification numbers unique for each chip CHIP is not required.

Effect of Second Embodiment

As described above, also in the semiconductor device 100 according to the second embodiment, it is not necessary to set a unique identification number for each memory chip 10 as in the case of the first embodiment. Any of the memory chips 10 can be uniquely selected by inputting the selection signal MF based on the stacking order of the memory chips 10. Further, since an N-bit selection signal MF (M>N≥2) is used to select one of the memory chips 10 on the M stages, the circuit area required for chip selection can be reduced.

In the foregoing, the invention made by the inventors of this application has been specifically described based on the embodiments, but it goes without saying that the present invention is not limited to the embodiments described above and can be modified in various ways within the range not departing from the gist thereof.

What is claimed is:

1. A semiconductor device comprising:
cascaded modules on M stages, each of the modules including an arithmetic circuit and a determination circuit; and
an interface circuit configured to input an N-bit selection signal (M>N≥2) for selecting any of the modules on the M stages to the arithmetic circuit of the module on a first stage,
wherein the arithmetic circuit of the module on the first stage performs an N-bit arithmetic operation on the N-bit selection signal,
wherein the arithmetic circuit of each of the modules on second to Mth stages performs the same N-bit arithmetic operation as that of the arithmetic circuit of the module on the first stage on an N-bit signal which is an operation result of the arithmetic circuit of the module on a preceding stage, and operation results of the respective arithmetic circuits of the modules on the M stages are different from each other, and
wherein, in each of the modules on the M stages, the determination circuit receives an input of the N-bit signal which is the operation result of the arithmetic circuit, and determines whether a bit string of the input N-bit signal matches a specific bit string commonly determined for the modules on the M stages.

2. The semiconductor device according to claim 1, wherein each arithmetic circuit is an N-bit adder configured to add a predetermined odd number to the input N-bit signal or an N-bit subtractor configured to subtract a predetermined odd number from the input N-bit signal.

3. The semiconductor device according to claim 2, wherein the predetermined odd number is 1.

4. The semiconductor device according to claim 1, wherein the M is $2^N$.

5. The semiconductor device according to claim 1, wherein the arithmetic circuits of two adjacent modules are connected via N signal lines.

6. The semiconductor device according to claim 1, wherein, in each of the modules on the M stages, the determination circuit generates an enable signal by performing a common logic operation in the modules on the M stages by using a value of each bit of the input N-bit signal, and the enable signal is asserted when a bit string of the N-bit signal input to the determination circuit matches the specific bit string.

7. The semiconductor device according to claim 6, wherein an internal circuit of each of the modules on the M stages becomes operable upon receiving the asserted enable signal.

8. The semiconductor device according to claim 6, the semiconductor device a stacked being semiconductor device including M stacked chips,
wherein the modules on the M stages respectively correspond to the M chips.

9. The semiconductor device according to claim 8, wherein each of the M chips is mounted with a memory circuit, and the chips are connected via a plurality of TSVs (Through Silicon Vias).

10. The semiconductor device according to claim 9, further comprising a chip mounted with a processor configured to access the memory circuit mounted in each of the M chips,
wherein, when accessing the memory circuit of selected chip among the M chips, the processor determines the selection signal such that the enable signal generated by the determination circuit of the selected chip is asserted, and causes the interface circuit to input the determined selection signal to the arithmetic circuit of the module on the first stage.

11. A semiconductor device comprising:
cascaded modules on M stages,
wherein each of the modules from a first stage to an (M−1)th stage includes an arithmetic circuit, and
wherein each of the modules on the M stages includes a determination circuit,
the semiconductor device further comprising:
an interface circuit configured to input an N-bit selection signal (M>N≥2) for selecting any of the modules on the M stages to the arithmetic circuit and the determination circuit of the module on the first stage,
wherein the arithmetic circuit of the module on the first stage performs an N-bit arithmetic operation on the input N-bit selection signal,
wherein the arithmetic circuit of each of the modules from second to (M−1)th stages performs the same N-bit arithmetic operation as that of the arithmetic circuit of the module on the first stage on an N-bit signal which is an operation result of the arithmetic circuit of the module on a preceding stage, and operation results of the arithmetic circuits of the respective modules are different from each other,
wherein the determination circuit of the module on the first stage determines whether a bit string of the input N-bit selection signal matches a specific bit string, and
wherein the determination circuit of each of the modules on second to Mth stages receives an input of the N-bit signal which is an operation result of the arithmetic circuit of the module on the preceding stage, and determines whether a bit string of the input N-bit signal matches the specific bit string.

* * * * *